(12) United States Patent
Bao et al.

(10) Patent No.: US 6,358,841 B1
(45) Date of Patent: Mar. 19, 2002

(54) METHOD OF COPPER CMP ON LOW DIELECTRIC CONSTANT HSQ MATERIAL

(75) Inventors: Tien I. Bao; Syun-Ming Jang, both of Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/379,279

(22) Filed: Aug. 23, 1999

(51) Int. Cl.[7] .............................................. H01L 21/44
(52) U.S. Cl. ........................ 438/633; 438/723; 438/786
(58) Field of Search ................................ 438/633, 687, 438/705, 706, 725, 737, 780, 781, 723, 756, 778, 782, 786

(56) References Cited

U.S. PATENT DOCUMENTS

| | | | |
|---|---|---|---|
| 4,847,162 A | 7/1989 | Haluska et al. | 428/457 |
| 5,059,448 A | 10/1991 | Chandra et al. | 427/53.1 |
| 5,334,554 A | 8/1994 | Lin et al. | 437/231 |
| 5,506,177 A | 4/1996 | Kishimoto et al. | 437/195 |
| 5,539,229 A | 7/1996 | Noble, Jr. et al. | 257/301 |
| 5,607,773 A | 3/1997 | Ahlburn et al. | 428/427 |
| 5,721,173 A | 2/1998 | Yano et al. | 438/424 |
| 5,786,262 A | 7/1998 | Jang et al. | 438/424 |
| 5,789,792 A | 8/1998 | Tsutsumi | 257/506 |
| 5,882,983 A | 3/1999 | Gardner et al. | 438/424 |
| 5,915,183 A | 6/1999 | Gambino et al. | 438/300 |
| 5,918,131 A | 6/1999 | Hsu et al. | 438/296 |
| 6,013,581 A * | 1/2000 | Wu et al. | 438/734 |
| 6,114,233 A * | 9/2000 | Yeh | 438/622 |

* cited by examiner

*Primary Examiner*—Olik Chaudhuri
*Assistant Examiner*—Ginette Peralta
(74) *Attorney, Agent, or Firm*—George O. Saile; Stephen B. Ackerman

(57) ABSTRACT

An improved and new process for fabricating a planarized structure of copper or other conductive material embedded in low dielectric constant HSQ insulator has been developed. The planarizing method comprises the key step of forming a protective layer on the surface of a cured HSQ layer by treatment of the cured HSQ layer in either an $NH_3$ plasma or a $N_2$ plasma. The $NH_3$ plasma or a $N_2$ plasma treatment may be applied to the cured HSQ prior to or subsequent to etching holes in the cured HSQ. Following deposition of copper or other conductive material into holes etched in the HSQ layer, CMP is used to remove the copper or other conductive material from the surface of the cured and treated HSQ. The $NH_3$ plasma or a $N_2$ plasma treatment reduces the CMP removal rate of HSQ by a factor of 3 when using a CMP slurry designed to polish copper.

18 Claims, 4 Drawing Sheets

METHOD OF COPPER CMP ON LOW DIELECTRIC CONSTANT HSQ MATERIAL

BACKGROUND OF THE INVENTION (1) Field of the Invention

This invention relates to a method of fabrication used for semiconductor integrated circuit devices, and more specifically to the formation of a planarized structure of copper or other conductor materials embedded in a low dielectric constant insulator, such as HSQ (hydrogen silsesquioxane). HSQ, an inorganic source of silicon oxide, has the chemical formula $(HSiO_{3/2})n$ and has a dielectric constant of about 2.9.

(2) Description of the Related Art

In the fabrication of semiconductor integrated circuits device element geometries have shrunk to and below 0.5 microns. At the same time the demands upon the interlevel dielectric layers and the conductive materials used for device interconnections have become more stringent. The interlevel dielectric layers must fill gaps with higher aspect ratios and must provide lower dielectric constants in order to reduce both interlevel and intra-level capacitance. Capacitance markedly increases when the spacing between conductive elements decreases below 0.5 microns and it becomes imperative that low dielectric constant material be used as both the interlevel and intra-level insulating material. Circuit speed is a function of the RC constant of the integrated circuit devices, where R is the resistance of the conducting portions of the integrated circuit and C is the capacitance, both interlevel and intra-level, of the integrated circuit structure. It is desirable that the RC constant be low, so a high conductivity material, such as copper is preferred for the interconnection elements of the integrated circuit and a low dielectric constant material, such as HSQ (hydrogen silsesquioxane) is preferred as the interlevel and intra-level insulating layers.

Furthermore, in order to meet the levels of integration required in circuits having geometries of less than 0.5 microns it is necessary to have multiple levels of interconnection wiring and processing methods must be employed which maintain layer planarity as additional layers of interconnection patterns are added to the device structure, since it is difficult to lithographically image and pattern layers applied to rough surfaces. To this end, CMP (Chemical Mechanical Polishing) has been used to provide smooth topography on insulating layers deposited on semiconductor substrates. Also, CMP can be used to remove different layers of material from the surface of a semiconductor substrate. For example, following contact hole formation in an insulating layer, a metallization layer is deposited and then CMP is used to produce planar metal plugs embedded in the insulating layer. Similarly, interconnection wiring can be formed by first etching wiring channels into an insulating layer and then depositing a metallization layer onto the insulating layer and into the etched channels. CMP is then used to remove the metallization layer from the surface of the insulating layer, leaving the metallization material embedded in the etched channels.

An important challenge in CMP, when selectively removing a second material layer from a first material layer, is to remove the second material without removing an excessive amount of the underlying first material layer. In the state-of-the-art application of CMP to formation of co-planar structures of copper conductive material embedded in HSQ insulating material a major deficiency exists because the CMP polishing slurries used to remove copper, also, remove HSQ at a high rate and therefore the HSQ must be protected with a polish stop layer, such as PECVD (Plasma Enhanced Chemical Vapor Deposited) oxide. The incorporation of PECVD oxide (which has a dielectric constant of about 4.0) into the structure negatively impacts the RC constant of the integrated circuit and limits the lowering of the RC constant which could be obtained when solely using HSQ (which has a dielectric constant of about 2.9) as the insulating material.

Numerous inventions address the formation of dielectric layers using HSQ, but none provide a suitable solution for combining CMP of copper or other conductive materials to form coplanar structures of copper or otter conductive materials embedded in HSQ insulating material. For example, U.S. Pat. No. 5,607,773 entitled "Method Of Forming A Multilevel Dielectric" granted Mar. 4, 1997 to Byron T. Ahlburn et al. describes a method of forming a silicon oxide dielectric layer from a hydrogen silsesquioxane (HSQ) source.

U.S. Pat. No. 5,334,554 entitled "Nitrogen Plasma Treatment To Prevent Field Device Leakage In VLSI Processing" granted Aug. 2, 1994 to Kwang-Ming Lin et al. shows a method of forming multiple layer metallurgy, spin-on-glass multilayer metallurgy structures in which a silicon oxide dielectric layer is exposed to a nitrogen containing plasma at a temperature of less than about 450° C. The nitrogen plasma treatment is responsible for the removal of the charge buildup problem in final product.

U.S. Pat. No. 5,506,177 entitled "Fabrication Process For Multilevel Interconnections In A Semiconductor Device" granted Apr. 9, 1996 to Koji Kishimoto et al. describes a method of forming an inter layer insulation layer of SOG (Spin-On-Glass) made from hydrogen silsesquioxane source. The method includes a pre-bake of the SOG by a first heat treatment at 200° C. for 2 min., followed by reflow of the SOG by a second heat treatment at a temperature higher than that of said first heat treatment.

U.S. Pat. No. 5,059,448 entitled "Rapid Thermal Process For Obtaining Silica Coatings" granted Oct. 22, 1991 to Grish Chandra et al. describes a method for forming an insulation layer from a hydrogen silsesquioxane source resin. The method includes a RTP (Rapid Thermal Process) step in order to heat the substrate sufficiently to convert the hydrogen silsesquioxane resin to a silica coating.

U.S. Pat. No. 4,847,162 "Multilevel Ceramics Coatings From The Ceramification Of Hydrogen Silsesquioxane Resin In The Presence Of Ammonia" granted Jul. 11, 1989 to Loren A. Haluska et al. describes a method for forming an insulation layer from a hydrogen silsesquioxane source resin in which a coating layer of the hydrogen silsesquioxane source resin is heated in the presence of $NH_3$ at a temperature between 200and 400° C.

The present invention is directed to a novel method of fabricating a planarized structure on a semiconductor substrate, wherein a conductive material is embedded in a low dielectric constant insulator, such as HSQ (hydrogen silsesquioxane). In the method of the present invention the HSQ layer is treated in $NH_3$ or $N_2$ plasmas to cause reduced CMP removal rates of the HSQ allowing CMP to be used to selectively remove the conductive material over the treated HSQ without significant attack of the treated HSQ. The method of the present invention does not require a CMP protection layer, such as deposited oxide, on top of the HSQ layer.

SUMMARY OF THE INVENTION

It is a general object of the present invention to provide an improved method of forming a planarized integrated circuit in which the interconnection metallization comprises copper or other conductor materials embedded in a low dielectric constant insulator, such as HSQ (hydrogen silsesquioxane).

A more specific object of the present invention is to provide an improved method of forming a planarized integrated circuit, wherein the planarized structure is formed by CMP of copper or other conductor materials after deposition of copper or other conductor materials onto an HSQ layer having etched channels therein.

Another object of the present invention is to provide an improved method of forming on a semiconductor substrate a planarized structure of copper or other conductive materials embedded in low dielectric constant HSQ material, in which CMP of the copper or other conductive materials is performed without excessive removal of low dielectric constant HSQ material.

In accordance with the present invention, the above and other objectives are realized by using a method of fabricating a planarized structure on a semiconductor substrate, wherein a conductive material is embedded in a low dielectric constant insulator, such as HSQ (hydrogen silsesquioxane). The method comprises the steps of: providing the semiconductor substrate; depositing a layer of HSQ (hydrogen silsesquioxane) onto the semiconductor substrate; curing the layer of HSQ; treating the layer of HSQ in an $NH_3$ plasma to form a hardened surface layer on the layer of HSQ; etching holes in the hardened surface layer on the layer of HSQ and said layer of HSQ; depositing a layer of conductive material onto the hardened surface layer on the layer of HSQ and within the holes etched in the hardened surface layer on the layer of HSQ and said layer of HSQ; and then chemical-mechanical polishing the layer of conductive material to remove the conductive material from the hardened surface layer on said layer of HSQ.

In a second embodiment of the present invention, the above and other objectives are realized by using a method of fabricating a planarized structure on a semiconductor substrate, wherein a conductive material is embedded in a low dielectric constant insulator, such as HSQ (hydrogen silsesquioxane), the method comprising the steps of: providing the semiconductor substrate; depositing a layer of HSQ (hydrogen silsesquioxane) onto the semiconductor substrate; curing the layer of HSQ; treating the layer of HSQ in a $N_2$ plasma to form a hardened surface layer on the layer of HSQ; etching holes in the hardened surface layer on the layer of HSQ and said layer of HSQ; depositing a layer of conductive material onto the hardened surface layer on the layer of HSQ and within the holes etched in the hardened surface layer on the layer of HSQ and said layer of HSQ; and then chemical-mechanical polishing the layer of conductive material to remove the conductive material from the hardened surface layer on said layer of HSQ.

In a third embodiment of the present invention, the above and other objectives are realized by using a method of fabricating a planarized structure on a semiconductor substrate, wherein a conductive material is embedded in a low dielectric constant insulator, such as HSQ (hydrogen silsesquioxane). The third method comprises the steps of: providing the semiconductor substrate; depositing a layer of HSQ (hydrogen silsesquioxane) onto the semiconductor substrate; curing the layer of HSQ; etching holes in the layer of HSQ; treating the layer of HSQ, having etched holes therein, in an $NH_3$ plasma to form a hardened surface layer on the layer of HSQ; depositing a layer of conductive material onto the hardened surface layer on the layer of HSQ and within the holes etched in the layer of HSQ; and chemical-mechanical polishing the layer of conductive material to remove the conductive material from the hardened surface layer on said layer of HSQ, leaving the conductive material embedded in the holes etched in the layer of HSQ.

And in yet a fourth embodiment of the present invention, the above and other objectives are realized by using a method of fabricating a planarized structure on a semiconductor substrate, wherein a conductive material is embedded in a low dielectric constant insulator, such as HSQ (hydrogen silsesquioxane), this fourth method comprising the steps of: providing the semiconductor substrate; depositing a layer of HSQ (hydrogen silsesquioxane) onto the semiconductor substrate; curing said layer of HSQ; etching holes in the layer of HSQ; treating the layer of HSQ, having etched holes therein, in an $N_2$ plasma to form a hardened surface layer on said layer of HSQ; depositing a layer of conductive material onto the hardened surface layer on the layer of HSQ and within the holes etched in said layer of HSQ; and chemical-mechanical polishing the layer of conductive material to remove the conductive material from the hardened surface layer on said layer of HSQ, leaving the conductive material embedded in the holes etched in the layer of HSQ.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1A:
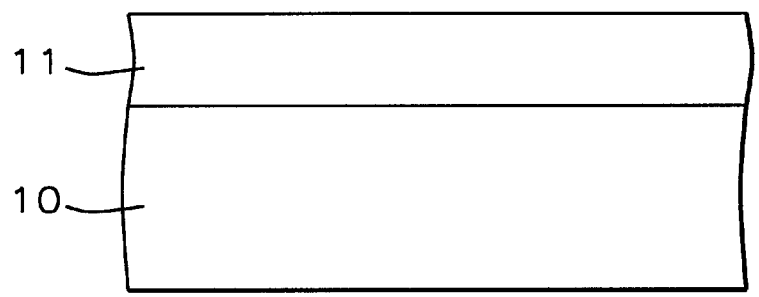
FIGS. 1A–1E, which in cross-sectional representation illustrate the method of one embodiment of the present invention.

The new and improved method of fabricating a planarized structure on a semiconductor substrate, wherein a conductive material is embedded in a low dielectric constant insulator, such as HSQ (hydrogen silsesquioxane) will now be described in detail.

In state-of-the-art integrated circuit fabrication processes cured HSQ has very high removal rates in the CMP slurries used to polish copper and other conductive materials. Therefore, in order to use CMP of these materials to form planarized structures of copper or other conductive materials embedded in HSQ it has been necessary to provide a CMP polish stop layer such as such as PECVD (Plasma Enhanced Chemical Vapor Deposited) oxide to protect the HSQ layer when using CMP to polish copper or other conductive materials. This necessity to use a polish stop layer largely reduces the benefit of using the low dielectric constant HSQ, having a dielectric constant of about 2.9, since PECVD oxide has a dielectric constant of about 4.1 or higher.

Considerable benefit is realized if the deposited and cured HSQ layer has low CMP removal rates in polishing slurries used to polish copper or other conductive materials. In this invention we show that treatment of cured HSQ in an $NH_3$ plasma or a $N_2$ plasma converts a surface layer of the HSQ to a hardened form of HSQ which is resistant to removal by CMP in slurries used to polish copper or other conductive materials.

Referring to Table 1, which compares the CMP removal rates of various materials, it is shown that treatment of HSQ in either an $NH_3$ plasma or a $N_2$ plasma greatly reduces the CMP removal rates of HSQ when polishing in CMP slurries designed to polish copper, TaN or oxide. For example, when using a CMP slurry designed to polish copper untreated HSQ has a polish removal rate of 127 Angstroms per min. The polish removal rate of the HSQ is reduced to 49 Angstroms per min. if the HSQ is first treated in an $NH_3$ plasma and is reduced to 37 Angstroms per min. if the HSQ is first treated in a $N_2$ plasma.

TABLE 1

CHEMICAL-MECHANICAL
POLISHING PROCESSES
CMP Removal Rates, Angstroms/min.

| MATERIAL | Cu CMP | TaN CMP | Oxide CMP (30 sec.) | Oxide CMP (15 sec.) |
|---|---|---|---|---|
| Cu | 2857 | 49 | 268 | |
| TaN | 103 | 263 | 470 | |
| FSG | 21 | 112 | 1430 | |
| TEOS | 20 | 117 | 1392 | |
| SiON | 51 | 134 | >1500 | |
| PEOX | 28 | 112 | 1162 | |
| SiN | 19 | 95 | 484 | |
| HSQ (Untreated) | 127 | 858 | 5230 | 4903 |
| HSQ $NH_3$ hardened | 49 | 121 | 4048 | 3448 |
| HSQ $N_2$ hardened | 37 | | 2496 | 1044 |

Likewise, when using a CMP slurry designed to polish TaN untreated HSQ has a polish removal rate of 858 Angstroms per min. and the polish removal rate of the HSQ is reduced to 121 Angstroms per min. if the HSQ is first treated in an $NH_3$ plasma. And, when using a CMP slurry designed to polish oxide untreated HSQ has a polish removal rate between about 4900 and 5200 Angstroms per min. The polish removal rate of HSQ first treated in an $NH_3$ plasma is reduced to between about 3450 and 4050 Angstroms per min. when using this same oxide polishing slurry. And the polish removal rate of HSQ first treated in a $N_2$ plasma is reduced to between about 1050 and 2500 Angstroms per min. Lower removal rates for the treated HSQ are observed for the 15 sec. oxide polish cycle compared to the 30 sec. oxide polish cycle because the $NH_3$ plasma or $N_2$ plasma treatments of HSQ produce a hardened surface layer on the HSQ where said hardened surface layer has maximum CMP removal resistance at the top surface and reduced CMP removal resistance at a distance into the HSQ layer.

It has been shown that treatment of cured HSQ in either an $NH_3$ plasma or a $N_2$ plasma produces a hardened protective layer on the surface of the treated HSQ and that such hardened protective layer has greatly reduced CMP removal rates when subjected to CMP slurries for polishing copper, TaN and oxide. Also, the dielectric constant of the treated HSQ is not compromised, remaining at about 2.9. Therefore, the treatment of cured HSQ in either an $NH_3$ plasma or a $N_2$ plasma permits the application of CMP to conductive materials deposited on the cured and treated HSQ without necessity to interpose a CMP stop layer and without risk of excessive removal of the HSQ layer during the CMP of the conductive layers.

Figure 1B:
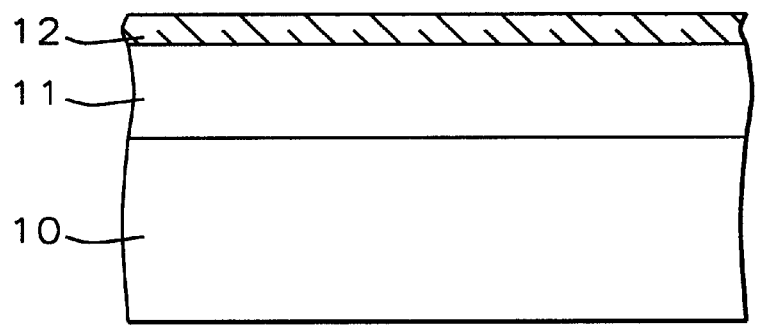
Figure 1C:
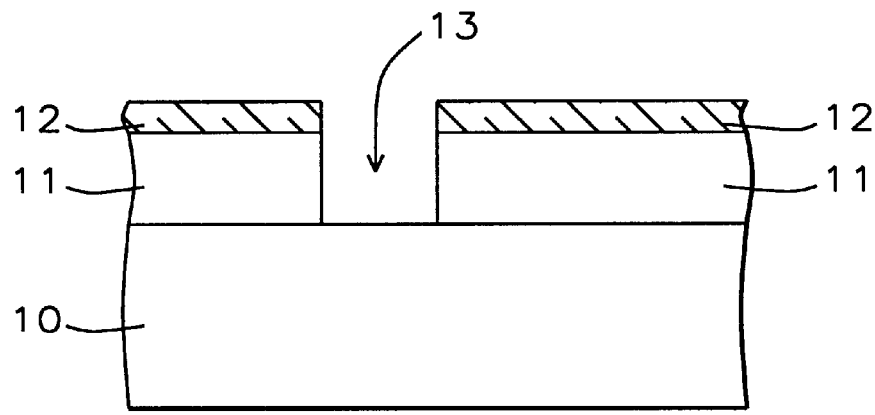
Figure 1D:
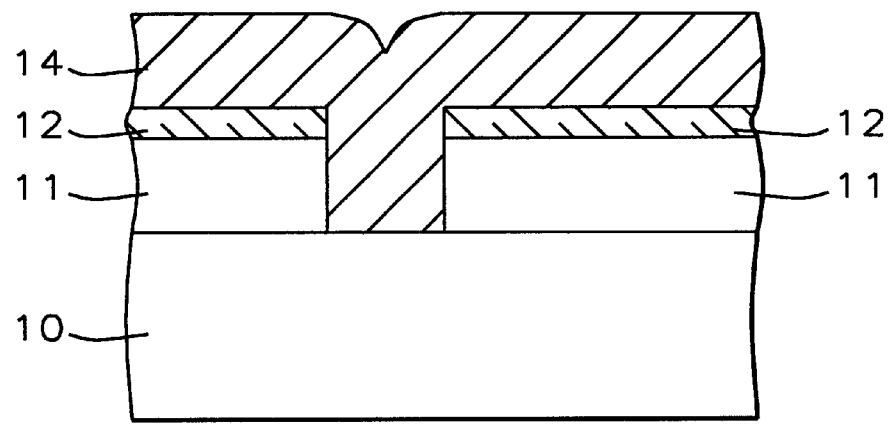
Figure 1E:
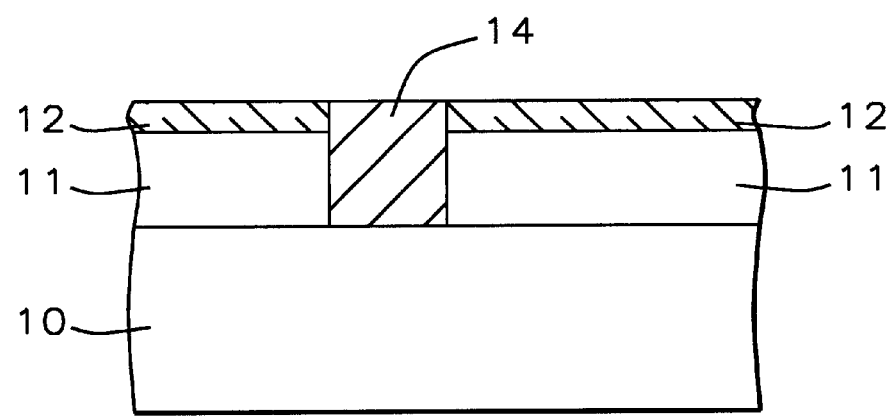

The method of one embodiment of the present invention is illustrated in FIGS. 1A–1E. Referring to FIGS. 1A–1E, a semiconductor substrate 10 is provided and a layer of HSQ (hydrogen silsesquioxane) 11 is formed thereon and cured by conventional heat treatment means. For example, the layer of HSQ may be formed by spin-on means and to a thickness between about 1000 and 20,000 Angstroms and cured at a temperature between about 100° and 500° C. The cured layer of HSQ is then exposed to an $NH_3$ plasma to form a hardened surface layer on the cured layer of HSQ. The $NH_3$ plasma is generated in flowing $NH_3$ gas at a pressure between about 1 and 20,000 mTorr with applied power of between about 1 and 10,000 Watts. The time of exposure of the cured layer of HSQ to the $NH_3$ plasma is between about 1 and 3600 sec. and results in a hardened surface layer 12 having a thickness between about 10 and 5000 Angstroms, as shown in FIG. 1B. Alternately, the cured layer of HSQ may be exposed to a $N_2$ plasma to form a hardened surface layer on the cured layer of HSQ. The $N_2$ plasma is generated in flowing $N_2$ gas at a pressure between about 1 and 20,000 mTorr with applied power of between about 1 and 10,000 Watts. The time of exposure of the cured layer of HSQ to the $N_2$ plasma is between about 1 and 3600 sec. and results in a hardened surface layer 12 having a thickness between about 10 and 5000 Angstroms. Then conventional photolithography masking and etching processes are used to etch holes 13 into the hardened surface layer 12 and the layer of HSQ 11, as shown in FIG. 1C. Now referring to FIG. 1D, a conductive material layer 14 is deposited onto the hardened surface layer 12 on the layer of HSQ 11 and within the holes etched in the hardened surface layer 12 and the layer of HSQ 11. The conductive material layer 14 may be copper having a thickness between about 1000 and 50,000 Angstroms. Alternately, the conductive material layer 14 may be aluminum or aluminum-copper-silicon having a thickness between about 1000 and 50,000 Angstroms. Conventional means are used to deposit the conductive material layer 14. CMP (Chemical-Mechanical Polishing) is then used to remove the conductive material layer 14 from the top of the hardened surface layer 12, resulting in a planarized structure having conductive material 14 embedded in HSQ layer 11 and hardened HSQ layer 12, as shown in FIG. 1E.

The formation of the hardened surface layer 12 on the cured HSQ layer 11 is the key processing step which allows CMP to be effectively used to form planarized structures of copper conductive material embedded in low dielectric constant HSQ. The hardened surface layer 12 substantially prevents attack of the cured HSQ layer 11 when using CMP to polish copper and other conductive materials deposited onto the HSQ layer.

Figure 2A:
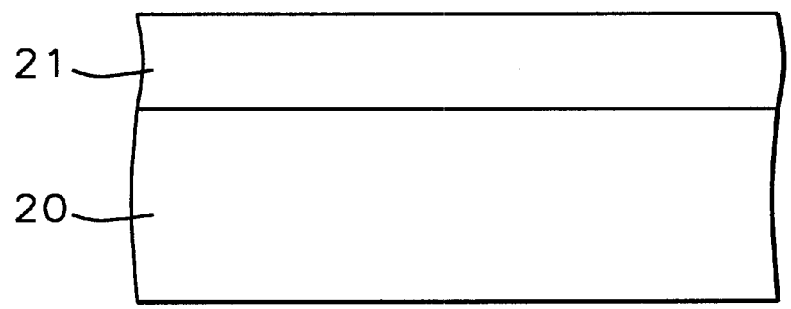
FIGS. 2A–2E, which in cross-sectional representation illustrate the method of a second embodiment of the present invention.
Figure 2B:
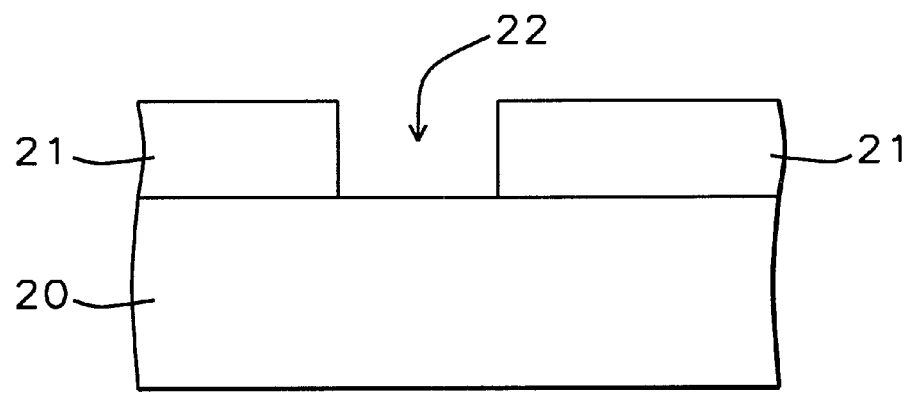
Figure 2C:
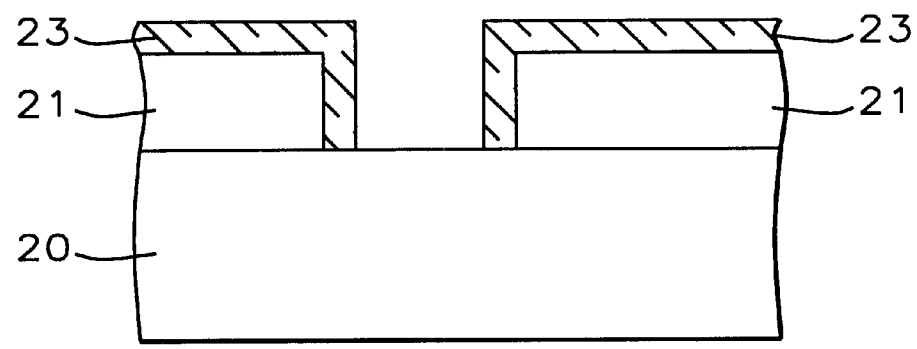
Figure 2D:
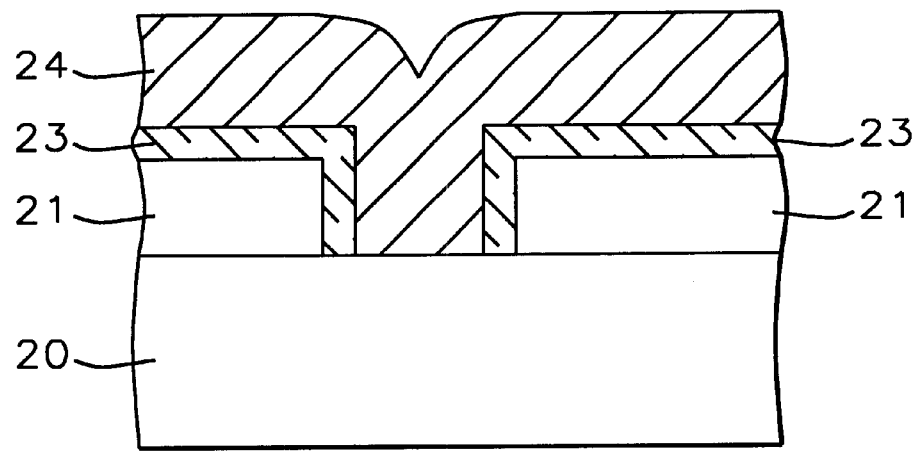
Figure 2E:
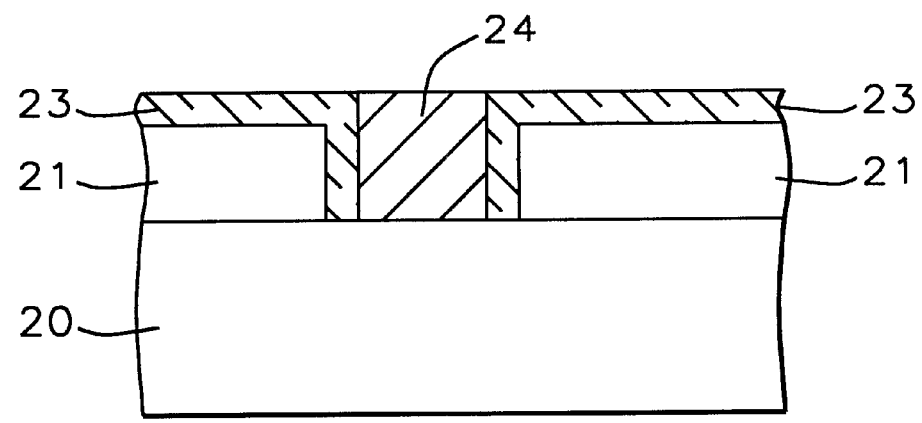

A second embodiment of the present invention is illustrated in FIGS. 2A–2E. Referring to FIGS. 2A, a semiconductor substrate 20 is provided and a layer of HSQ (hydrogen silsesquioxane) 21 is formed thereon and cured by conventional heat treatment means. For example, the layer of HSQ may be formed by spin-on means and to a thickness between about 1000 and 20,000 Angstroms and cured at a temperature between about 100° and 500° C. Conventional photolithography masking and etching processes are used to etch holes 22 into the layer of HSQ 21, as shown in FIG. 2B. The cured layer of HSQ 21, having holes 22 etched therein, is then exposed to an $NH_3$ plasma to form a hardened surface layer 23 on the cured layer of HSQ 21. The $NH_3$ plasma is generated in flowing $NH_3$ gas at a pressure between about 1 and 20,000 mTorr with applied power of between about 1 and 10,000 Watts. The time of exposure of the cured layer of HSQ to the $NH_3$ plasma is between about 1 and 3600 sec. and results in a hardened surface layer 23 having a thickness between about 10 and 5000 Angstroms, as shown in FIG. 2C. Alternately, the cured layer of HSQ may be exposed to a $N_2$ plasma to form a hardened surface layer on the cured layer of HSQ. The $N_2$ plasma is generated in flowing $N_2$ gas at a pressure between about 1 and 20,000 mTorr with applied power of between about 1 and 10,000 Watts. The time of exposure of the cured layer of HSQ to the $N_2$ plasma is between about 1 and 3600 sec. and results in a hardened surface layer 23 having a thickness between about 10 and 5000 Angstroms. Now referring to FIG. 2D, a conductive material layer 24 is deposited onto the hardened surface layer 23 on the layer of HSQ 21 and within the holes etched in the layer of HSQ 21. The conductive material layer 24 may be copper having a thickness between about 1000 and 50,000 Angstroms. Alternately, the conductive material layer 24 may be aluminum or aluminum- copper-silicon having a thickness between about 1000 and 50,000 Angstroms. Conventional means are used to deposit the conductive material layer 24. CMP (Chemical-Mechanical Polishing) is then used to remove the conductive material layer 24 from the top of the hardened surface layer 23, resulting in a planarized structure having conductive material 24 embedded in HSQ layer 21 and hardened HSQ layer 23, as shown in FIG. 2E.

Again, the formation of the hardened surface layer 23 on the cured HSQ layer 21 is the key processing step which allows CMP to be effectively used to form planarized structures of copper conductive material embedded in low dielectric constant HSQ. The hardened surface layer 23 substantially prevents attack of the cured HSQ layer 21 when using CMP to polish copper and other conductive materials deposited onto the HSQ layer.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a planarized structure on a semiconductor substrate, wherein a conductive material is embedded in a low dielectric constant insulator, such as HSQ (hydrogen silsesquioxane), the method comprising the following steps;

providing the semiconductor substrate;

depositing a layer of HSQ (hydrogen silsesquioxane) onto said semiconductor substrate;

curing said layer of HSQ without changing the dielectric constant of said layer of HSQ;

treating said layer of HSQ in an $NH_3$ plasma to form a hardened surface layer on said layer of HSQ, said hardened surface layer having substantially the same dielectric constant as said layer of HSQ;

etching holes in said hardened surface layer on said layer or HSQ and sad layer of HSQ;

depositing a layer of conductive material onto the hardened surface layer on said layer of HSQ and within the holes etched in said hardened surface layer on said layer of HSQ and said layer of HSQ; and chemical-mechanical polishing the layer of conductive material to remove the conductive material from said hardened surface layer on said layer of HSQ.

2. The method of claim 1, wherein said $NH_3$ plasma treatment is performed at between about 1 and 20,000 mTorr with applied power of between about 1 and 10,000 Watts.

3. The method of claim 1, wherein said hardened surface layer on said layer of HSQ has a thickness between about 10 and 5000 Angstroms.

4. The method of claim 1, wherein said layer of conductive material is copper deposited to a thickness between about 1000 and 50,000 Angstroms.

5. The method of claim 1, wherein said layer of conductive material comprises a barrier layer of TaN and conductive material of copper.

6. A method of fabricating a planarized structure on a semiconductor substrate, wherein a conductive material is embedded in a low dielectric constant insulator, such as HSQ (hydrogen silsesquioxane), the method comprising the following steps:

providing the semiconductor substrate;

depositing a layer of HSQ (hydrogen silsesquioxane) onto said semiconductor substrate;

curing said layer of HSQ without changing the dielectric constant of said layer of HSQ;

treating said layer of HSQ in a $N_2$ plasma to form a hardened surface layer on said layer of HSQ, said hardened surface layer having substantially the same dielectric constant as said layer of HSQ;

etching holes in said hardened surface layer on said layer of HSQ and said layer of HSQ;

depositing a layer of conductive material onto the hardened surface layer on said layer of HSQ and within the holes etched in said hardened surface layer on said layer of HSQ and said layer of HSQ; and chemical-mechanical polishing the layer of conductive material to remove the conductive material from said hardened surface layer on said layer of HSQ.

7. The method of claim 6, wherein said $N_2$ plasma treatment is performed at between about 1 and 20,000 mTorr with applied power of between about 1 and 10,000 Watts.

8. The method of claim 6, wherein said hardened surface layer on said layer of HSQ has a thickness between about 10 and 5000 Angstroms.

9. The method of claim 6, wherein said layer of conductive material is copper deposited to a thickness between about 1000 and 50,000 Angstroms.

10. The method of claim 6, wherein said layer of conductive material comprises a barrier layer of TaN and conductive material of copper.

11. A method of fabricating a planarized structure on a semiconductor substrate, wherein a conductive material is embedded in a low dielectric constant insulator, such as HSQ (hydrogen silsesquioxane), the method comprising the following steps:

providing the semiconductor substrate;

depositing a layer of HSQ (hydrogen silsesquioxane) onto said semiconductor substrate;

curing said layer of HSQ without changing the dielectric constant of said layer of HSQ;

etching holes in said layer of HSQ;

treating sad layer of HSQ in an $NH_3$ plasma to form a hardened surface layer on said layer of HSQ, said hardened surface layer having substantially the same dielectric constant as said layer of HSQ;

depositing a layer of conductive material onto the hardened surface layer on said layer of HSQ and within the holes etched in said layer of HSQ; and chemical-mechanical polishing the layer of conductive material to remove the conductive material from said hardened surface layer on said layer of HSQ.

12. The method of claim 11, wherein said hardened surface layer on said layer of HSQ has a thickness between about 10 and 5000 Angstroms.

13. The method of claim 11, wherein said layer of conductive material is copper deposited to a thickness between about 1000 and 50,000 Angstroms.

14. The method of claim 11, wherein said layer of conductive material comprises a barrier layer of TaN and conductive material of copper.

15. A method of fabricating a planarized structure on a semiconductor substrate, wherein a conductive material is embedded in a low dielectric constant insulator, such as HSQ (hydrogen silsesquioxane), the method comprising the following steps:

provide the semiconductor substrate;

depositing a layer of HSQ (hydrogen silsesquioxane) onto said semiconductor substrate;

curing said layer of HSQ without changing the dielectric constant of said layer of HSQ;

etching holes in said layer of HSQ;

treating said layer of HSQ, having etched holes therein, in a $N_2$ plasma at between about 1 and 20,000 mTorr with applied power of between about 1 and 10,000 Watts to form a hardened surface layer on said layer of HSQ, said hardened surface layer having substantially the same dielectric constant as said layer of HSQ;

depositing a layer of conductive material onto the hardened surface layer on said layer of HSQ and within the holes etched in said layer of HSQ; and chemical-mechanical polishing the layer of conductive material to remove the conductive material from said hardened surface layer on said layer of HSQ.

16. The method of claim 15, wherein said hardened surface layer on said layer of HSQ has a thickness between about 10 and 5000 Angstroms.

17. The method of claim 15, wherein said layer of conductive material is copper deposited to a thickness between about 1000 and 50,000 Angstroms.

18. The method of claim 15, wherein said layer of conductive material comprises a barrier layer of TaN and conductive material of copper.

* * * * *